United States Patent [19]

Patterson et al.

[11] Patent Number: 5,080,958

[45] Date of Patent: Jan. 14, 1992

[54] MULTILAYER INTERCONNECTS

[75] Inventors: Frank K. Patterson, Wilmington, Del.; Carl E. Killian, North East, Md.

[73] Assignee: E. I. Du Pont de Nemours and Company, Wilmington, Del.

[21] Appl. No.: 387,901

[22] Filed: Aug. 1, 1989

[51] Int. Cl.⁵ .............................. B32B 9/00
[52] U.S. Cl. ..................... 428/209; 428/137; 428/210; 428/426; 428/432; 428/688; 428/457; 428/901; 361/397; 427/96; 156/60
[58] Field of Search .............. 428/137, 209, 210, 426, 428/432, 688, 457, 901; 361/397; 156/60; 427/96

[56] References Cited

U.S. PATENT DOCUMENTS

| | | | |
|---|---|---|---|
| 4,740,414 | 4/1988 | Shaheen | 428/432 |
| 4,804,575 | 2/1989 | Kohm | 428/209 |
| 4,836,651 | 6/1989 | Anderson | 350/336 |
| 4,915,983 | 4/1990 | Lake et al. | 427/98 |
| 4,927,742 | 5/1990 | Kohm | 430/311 |

Primary Examiner—Patrick J. Ryan

[57] ABSTRACT

A multilayer interconnect comprising a ceramic substrate, a patterned conductor layer, a layer of acrylic or acrylate adhesive, an organic insulating film, and a metal foil layer. Active electrical components can be soldered onto the metal foil layer. These circuits are particularly useful in under the hood automotive applications.

9 Claims, 1 Drawing Sheet

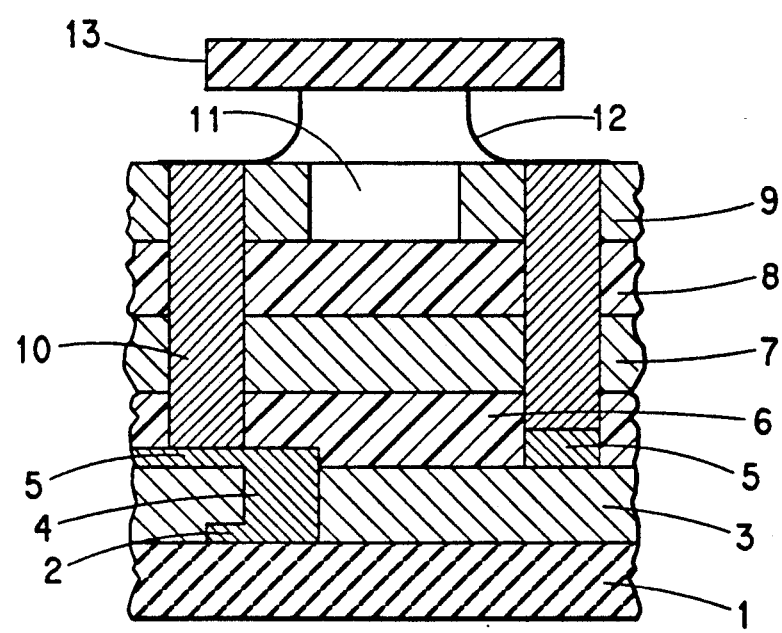

MULTILAYER INTERCONNECTS

FIELD OF THE INVENTION

The invention relates to multilayer interconnects, especially those useful in making multilayer interconnects which have discrete surface mounted components soldered thereto.

BACKGROUND

Ceramic multilayer circuits have been used for many years to increase circuit functionality per unit of area. With single layer circuits, all discrete components must be mounted on the surface of the single layer. The number of discrete components and hence, the complexity and size of the circuitry, is limited by the size of the single layer surface. With multilayer circuits, passive components such as capacitors and resistors can be embedded into the alternating dielectric and patterned conductive layers which make up the body of the multilayer circuit. The patterned conductive layers and components within the body of the multilayer circuit are electrically connected by vias which are filled with conductive metallization. In this way, the density and complexity of the circuitry can be increased without significantly increasing the dimensions of the entire construct.

Today, circuits are being used in increasingly varied applications. These new applications make new demands on the circuits. One such application pertains to circuit assemblies comprising active and passive components. In some cases, the active components are housed in plastic leaded chip carriers having a thermal coefficient of expansion (TCE) of 100 which are soldered to metallized ceramic having a TCE of less than 100. This application requires the circuit assemblies to withstand hostile temperature environments, such as thousands of cycles wherein the circuit assemblies are repeatedly placed in an oven maintained at 150° C. for 30 minutes and then transferred to a chamber maintained at −50° C. for another 30 minutes. A major problem encountered by multilayer circuit assemblies under these conditions can be rupture of the solder bond between the active components and the metallized ceramic due to the different TCE's of the plastic leaded chip carriers and the metallized ceramic. This rupture destroys the integrity of the electrical connection between the discrete active components soldered onto the surface of the multilayer body and the patterned conductive layers within the multilayer body. Applicants have discovered a multilayer interconnect which overcomes this problem of the TCE mismatch, offers interconnect design advantages such as a flex/rigid constructions, and is capable of withstanding thousands of thermal cycles in hostile temperature environments such as those encountered in automotive applications, e.g., under the hood, etc.

SUMMARY OF THE INVENTION

The invention is directed to a multilayer interconnect comprising a ceramic substrate, a patterned conductor layer, a layer of acrylic or acrylate adhesive, an organic insulating film, and a metal foil layer, wherein the acrylic adhesive comprises 90-99 wt. % of a terpolymer having 15-65 wt. % acrylonitrile, methacrylonitrile, or mixtures thereof, 30-84 wt. % butyl acrylate, ethyl acrylate, 2-ethylhexyl acrylate, lauryl acrylate, or mixtures thereof, and 1-15 wt. % methacrylic acid, acrylic acid, itaconic acid, or mixtures thereof, and 10-1 wt. % cross-linking resin; and the acrylate adhesive comprises 90-99 wt. % of a latex copolymer prepared by free radical-initiated aqueous emulsion polymerization of a mixture of nonacidic monomers comprising 50-60 wt. % lower alkyl acrylate, 30-40 wt. % acrylonitrile, methacrylonitrile or mixtures thereof, and 5-12 wt. % glycidyl acrylate, glycidyl methacrylate or mixtures thereof, having a glass transition temperature of 0-55 C. and a weight average molecular weight of 150,000-1,000,000, and 10-1 wt. % of a water-soluble cross-linking agent.

The invention is further directed to the manufacture of these multilayer interconnects.

BRIEF DESCRIPTION OF THE DRAWING

The FIGURE is a cross-sectional view of a multilayer interconnect of the invention having a discrete component soldered thereto.

DETAILED DESCRIPTION OF THE INVENTION

Ceramic

The ceramic substrate may be composed of glass, crystallizable glass, ceramic-filled glass, alumina, aluminum nitride, beryllia, silicon carbide or any other suitable ceramic material. If multiple ceramic dielectric layers are desired, different materials may be used for each layer. However, the materials should have similar TCE's to avoid warping and delamination upon firing. For example, alumina ceramic layers and crystallizable glass ceramic layers may both be used in a single multilayer interconnect. The base ceramic layer is usually about 20 mils to about 30 mils thick. Preferably, the base layer is about 25 mils thick. Any other ceramic layer is usually about 1.5 mils to about 30 mils thick.

Patterned Conductor Layer

The patterned conductor layers may be any suitable precious or base metal. The precious metals are preferred. Copper, silver, palladium, gold, platinum and mixtures thereof are particularly preferred. These mixtures of metals include physical mixtures and alloys. A patterned conductor layer may be a circuit pattern formed for example, by screen printing a thick film conductor composition in a predetermined pattern onto a substrate. The substrate is usually a dielectric and may have vias formed therein. Typically, patterned conductor layers on a substrate are about 0.3 mil to about 0.7 mil thick. Preferably, these layers are about 0.5 mil thick. Alternatively, a patterned conductor layer may be a pattern of metallized vias formed in dielectric material, such as a dielectric ceramic tape.

Adhesive

The adhesive layer includes either an acrylic adhesive or an acrylate adhesive. The acrylic adhesive is disclosed in U.S. Pat. Nos. 3,822,175 and 3,900,662, both of which are herein incorporated by reference. This acrylic adhesive composition comprises a terpolymer having 15-65 wt. % acrylonitrile, methacrylonitrile, or mixtures thereof, 30-84 wt. % butyl acrylate, ethyl acrylate, 2-ethylhexyl acrylate, lauryl acrylate, or mixtures thereof, and 1-15 wt. % methacrylic acid, acrylic acid, itaconic acid, or mixtures thereof. Also included should be a cross-linking agent such as melamine formaldehyde, phenol formaldehyde, or melamines such as hexamethoxymethyl melamine and the like. The cross-linking agent can be present in an amount of about 1-10% by weight of terpolymer. A preferred acrylic adhesive composition comprises a terpolymer of acrylonitrile/butyl acrylate/methacrylic acid in about a 35/60/5 ratio by weight mixed with 5% phenol formaldehyde by weight based on the weight of the terpolymer.

The acrylic adhesive composition can be made by known addition polymerization techniques, such as those disclosed in Sanderson, U.S. Pat. No. 3,032,521, issued May 1, 1962, the disclosure of which is hereby incorporated by reference.

Preferably, the acrylic adhesive compositions are contained in a dispersion in water. If desired, such aqueous dispersions can contain thickeners, such as polyacrylate thickeners. A suitable thickener is Acrysol. ASE-60 polyacrylate thickener available from Rohm and Haas Company. However, if desired, the acrylic adhesive can be contained in a dispersion or solution in suitable organic liquid or mixtures of organic liquids, for example, aromatic hydrocarbons such as toluene, xylene, etc.; aliphatic hydrocarbons such as hexane, octane, etc.; esters such as ethyl acetate, etc.; ketones such as methyl ethyl ketone and methylisobutyl ketone; and ethers such as monoethers of ethylene glycol. Examples of suitable organic liquids are disclosed in U.S. Pat. No. 3,032,521.

The acrylate adhesive comprises a latex copolymer component prepared by free radical-initiated aqueous emulsion polymerization of a mixture of nonacidic monomers comprising 50-60 wt. % lower alkyl acrylate, 30-40 wt. % acrylonitrile, methacrylonitrile, or mixtures thereof, and 5-12 wt. % glycidyl acrylate, glycidyl methacrylate or mixtures thereof. The resulting copolymer must have a glass transition temperature, $T_g$, of 0°-55° C. and a weight average molecular weight, $M_w$, of 300,000-2,000,000.

As used herein, the term "lower alkyl" means $C_{1-4}$ alkyl groups.

When it is desired to have a low flow (high viscosity) acrylate composition, it is preferred that $M_w$ of the copolymer be 1,500,000-2,000,000. On the other hand, when it is desired to have a high flow (low viscosity) acrylate composition, it is preferred that $M_w$ of the copolymer be 300,000-900,000. Such latex copolymers can be made by conventional latex polymerization techniques such as those disclosed by Sanderson in U.S. Pat. No. 3,032,521, which is incorporated herein by reference.

A preferred low flow acrylate copolymer is a latex copolymer of 35/55/10 by weight acrylonitrile/butyl acrylate/glycidyl methacrylate having a $T_g$ of 40° C. and $M_w$ of 1,600,000. A preferred high flow copolymer is one of the same monomer composition, the $M_w$ of which is only 850,000.

The acrylate adhesive of the invention includes the above-described latex copolymers and 1-10 wt. % of a water-soluble crosslinking agent such as melamine formaldehyde, phenol formaldehyde, urea formaldehyde and the like. These crosslinking agents are present in an amount of about 1-10% by weight of the latex copolymer. A polyvinyl alcohol thickener can be used to vary viscosity.

The foregoing acrylate adhesive compositions of the invention are disclosed in greater detail and claimed in U.S. copending applications Ser. Nos. 07/376,195, filed May 1, 1989 and 07/361,788, filed May 30, 1989, both of which are herein incorporated by reference.

The adhesive composition of the invention may contain surface tension and viscosity control agents as well as fillers, colorants, and flame retardant additives. In particular, 95 wt. % acrylate copolymer is combined with 5 wt. % phenol formaldehyde resin to provide a preferred adhesive composition to which about 0.5 wt. % polyvinyl alcohol of molecular weight above 100,000 is added as a thickener. Other compatible thickening agents can be employed to facilitate film formation prior to drying.

These compositions bond to organic films, metal layers and ceramic layers and are able to withstand elevated temperatures. Additionally, applicants have found that these compositions relieve the stress created by the TCE mismatch between various layers, particularly plastic components and metallized ceramic layers, even under hostile temperature conditions. The amount of adhesive should be enough to encapsulate the passive thick film components such as resistors, on the ceramic layer. Typically, the adhesive layer is about 0.3 to 1.2 mils thick, preferably 0.5 to 1.0 mils.

Organic Insulating Film

The organic insulating film may be composed of any suitable organic material which prevents the transfer of electricity under hostile temperature conditions between the metal foil layer and the patterned conductive layer nearest the film. Polyether-ether ketones, fluoropolymers such as polytetrafluoroethylene and perfluoroalkoxy, and polyimides are preferred organic insulating films. Polyimides are particularly preferred. The organic insulating film may be about 0.3 to 1.2 mils thick, preferably 0.5 to 1.0 mils.

Metal Foil Layer

The metal foil layer may be composed of any metal foil which is conductive and to which leads of discrete electrical components can be securely soldered. Copper, copper alloys, silver, silver alloys, gold and gold alloys are preferred. Copper is particularly preferred. The metal foil layer may be about 0.5 to 2.0 mils thick, preferably 0.7 to 1.4 mils.

Multilayer Interconnect

The multilayer interconnect of the invention can be formed by:

a. laminating a composite comprising a bottom layer of the above-described adhesive, an organic insulating film and a top metal foil layer to the outermost patterned conductive layer and exposed ceramic areas of an assemblage comprising at least one layer of ceramic having a patterned conductive layer thereon;

b. forming a patterned array of vias in the composite layers such that the vias are in registration with the outermost patterned conductive layer of step a.; and c. metallizing the vias so as to electrically connect the underlying pattern with the top pattern.

Assemblage

The assemblage comprising at least one layer of ceramic having a patterned conductive layer thereon can be formed by various known methods. If the assemblage consists of only one ceramic layer having a patterned conductive layer, a thick film conductive composition can be screen printed in a predetermined pattern onto a base ceramic layer. A rigid ceramic base such as alumina or a ceramic base which is capable of being rigid such as an unfired ceramic tape which becomes rigid upon firing is preferred. This base ceramic layer is usually about 20 mils to about 30 mils thick. Preferably, the base layer is about 25 mils thick. Any conventional thick film conductive composition can be used. Such compositions usually comprise finely divided conductive metal particles and inorganic binder particles dispersed in an inert organic medium. The medium is selected such that the dispersion can be applied to the dielectric substrate using "thick film" techniques such as screen printing. These inert organic mediums are discussed in greater detail below. Upon firing or sintering of the printed film, the metallic component of the composition provides the functional (conductive) utility, while the inorganic binder (e.g., glass, $Bi_2O_3$, etc.) bonds the metal particles to one another and to the substrate.

If additional functional layers are desired in the assemblage, various methods can be used to build these additional layers on the patterned conductive layer and exposed areas of the base ceramic layer. One such method is the tape method. Another method is the thick film method.

In the tape method, unfired dielectric tapes are laid down interspersed with printed conductive layers. The unfired dielectric tapes are made by casting a dispersion of dielectric material in a polymeric binder latex or solution of polymeric binder in volatile organic solvent onto a flexible substrate such as a steel belt or polymeric film, and then heating the cast layer to remove the volatile solvent therefrom. Examples of dielectric material include glass such as borosilicates and aluminosilicates, glass frit, glass ceramic, polymer filled with inert particles, refractory inorganic solids such as alumina, mullite, betaspodumene, cordierite, alpha-quartz, $CaZrO_3$, and fused silica, and mixtures thereof. Mixtures of glass and refractory inorganic solids are preferred dielectric material. Particularly preferred material comprises 40-70% volume noncrystallizable glass having a softening point of at least 500° C. and a viscosity of $1 \times 10^6$ poises or less at 825°-1025° C. and 60-30% volume of a mixture of refractory oxides comprising 1-59% volume alumina and 59-1% volume of a secondary refractory selected from alpha-quartz, $CaZrO_3$, fused silica, cordierite, mullite and mixtures thereof, the maximum amount of alpha-quartz, $CaZrO_3$, or fused silica being 20% volume, basis total glass and refractory oxides. These particularly preferred materials are disclosed in greater detail in U.S. Pat. No. 4,655,864 to Rellick, which is incorporated by reference herein.

The organic medium in which the dielectric material is dispersed is comprised of the polymeric binder latex or solution of polymeric binder in a volatile organic solvent. Optionally, other materials such as plasticizers, release agents, dispersing agents, stripping agents, antifouling agents and wetting agents may be dissolved in the medium.

A wide variety of polymeric materials are suitable as the binder. These materials include poly(vinyl butyral), poly(vinyl acetate), poly(vinyl alcohol), cellulosic polymers such as methyl cellulose, theyl cellulose, hydroxyethyl cellulose, methylhydroxyethyl cellulose, atactic polypropylene, polyethylene, silicon polymers such as poly(methyl siloxane), poly(methyl phenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates such as copolymers of ethyl methacrylate and methyl acrylate and terpolymers of ethyl acrylate, methyl methacrylate and methacrylic acid. These materials burn out rather easily when the tapes are fired in air at temperatures, such as about 800° to 950° C. Usala, in U.S. Pat. No. 4,536,535, discloses a class of compatible multipolymers which are particularly useful binders in air firable systems.

In some instances, for example when copper comprises the metal, the tapes are fired in a nonoxidizing atmosphere. Short firing cycles and firing temperatures such as about 825°- about 1025° C. are typical process parameters when firing in a nonoxidizing atmosphere versus air. Poly(alpha-methyl styrene) and polymers of methacrylates such as those described by Rellick in U.S. Pat. No. 4,655,864 are particularly suitable binders for tapes fired in nonoxidizing atmospheres.

The volatile organic solvent component of the organic medium is chosen so as to obtain complete solution of the polymer and sufficiently high volatility to enable the solvent to be evaporated from the dispersion by application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, 1,1,1-trichloroethane, tetrachloroethylene, amyl acetate, 2,2,4-triethyl pentanediol-1,3-monoiso-butyrate, toluene, methylene chloride and fluorocarbons. It will be recognized that individual components of the solvent may not be complete solvents for the binder polymer. Yet, when blended with other solvent components, they function as solvents.

In making multilayer assemblages using the tape method, vias are formed by punching or by laser burning a layer of unfired tape in an appropriate patterned array. One or more unfired tapes can be used, depending upon the desired thickness of the ceramic layer. The unfired tape layer or layers as the case may be, is laminated over the printed surface of the base ceramic layer. Typical lamination conditions are 50°-70° C. at 500-2,000 psi. The laminate may be fired at this point or the complete multilayer assemblage may be cofired after all the functional layers have been applied. Firing can be performed at temperatures of about 825°-about 1025° C.

When three or fewer dielectric layers are present in a multilayer assemblage, it may be preferred to intersperse the patterned conductive layers of the assemblage with dielectric thick film compositions rather than the dielectric tapes.

Dielectric thick film compositions are usually applied by such techniques as screen printing. When it is desired to apply the dielectric as a thick film composition, a dispersion of the previously described dielectric material in a conventional thick film organic media can be used with appropriate rheological adjustments and the use of lower volatility solvents. In this event, the compositions must have appropriate viscosity so that they can be passed through the screen readily. In addition, they should be thixotropic in order that they set up rapidly after being acreened, thereby giving good resolution. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

In view of all these criteria, a wide variety of inert liquids can be used as organic medium. The organic medium for most thick film compositions is typically a solution of resin in a solvent and, frequently, a solvent solution containing both resin and thixotropic agent. The solvent usually boils within the range of 130°-350° C.

Especially suitable resins for this purpose are celluloses such as ethyl cellulose, polymethacrylates of lower alcohols and monobutyl ether of ethylene glycol monoacetate.

The most widely used solvents for thick film applications are terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. Various combinations of these and other solvents are formulated to obtain the desired viscosity and volatility requirements for each application.

Among the thixotropic agents which are commonly used are hydrogenated castor oil and derivatives thereof. It is, of course, not always necessary to incorporate a thixotropic agent since the solvent/resin properties coupled with the shear thinning inherent in any suspension may alone be suitable in this regard.

The ratio of organic medium to inorganic solids in the dispersions can vary considerably and depends upon the manner in which the dispersion is to be applied and the kind of organic medium used. Normally, to achieve good coverage, the dispersions will contain complementary by weight 60-90% solids and 40-10% organic medium. Such dispersions are usually of semifluid consistency and are referred to commonly as "pastes".

The amount and type of organic medium utilized is determined mainly by the final desired formulation viscosity and print thickness.

In making multilayer assemblages using the thick film method, a conductive thick film composition can be screen printed in a predetermined pattern onto the ceramic base. The combination of the base and patterned conductive layer is dried at temperatures of about 100° about 150° C., then fired at temperatures of about 825°- about 1025° C. A dielectric thick film composition can then be screen printed over the printed surface of the base ceramic layer followed by drying and firing. And a conductive thick film composition can be screen printed in a predetermined pattern onto the first thick film dielectric layer followed by drying and firing. This process can be repeated as many times as desired.

Composite

The adhesive composition of this invention is applied to the organic insulating film by conventional application procedures such as spraying, drying, printing, brushing, extrusion, dip coating, and roll coating. If desired, the adhesive can contain reinforcing and/or extender material suitable for the organic film. Both sides of the film can be coated with the adhesive. The metal foil layer may then be adhered to one side of the coated film to form the composite. Alternatively, the metal foil layer may be joined to organic film by electrodeposition or sputtering.

Vias corresponding to the patterned conductive layer on the outermost layer of the assemblage are formed in the composite layers by conventional means such as punching or laser drilling.

Referring to the figure, an assemblage comprising a ceramic substrate 1, a patterned conductor layer 2, a dielectric layer 3 having at least one via 4 which corresponds to the underlying patterned conductor layer 2, and a patterned conductor layer 5, is produced by the aforementioned tape method. Patterned conductor layer 5 corresponds to via 4 in dielectric layer 3. Via 4 is metallized to electrically connect underlying conductive pattern 2 with patterned conductor layer 5.

A composite comprising an organic insulating film 7, acrylic or acrylate adhesive layer 8, and metal foil layer 9 can be formed by lamination. An additional acrylic or adhesive layer 6 can be laminated to the exposed surface of film 7. Either before or after the lamination of adhesive layer 7, a patterned array of vias 10 can be formed and optionally, metallized in layers 6-9, the vias corresponding to patterned conductive layer 5. A multilayer interconnect of the invention can be constructed by adhering exposed adhesive layer 6 of the composite to the exposed surface of dielectric layer 3 and conductor layer 5 of the assemblage. This can be done by applying heat and pressure sufficient to initiate and effect complete crosslinking of the crosslinking agent in the adhesive without altering the patterned conductive layers of the assemblage. A predetermined pattern 11 can then be etched into the metal foil layer 9 by chemical etching. Suitable chemical etchants include cupric chloride, ferric chloride, ammoniated cupric chloride, and a sulfuric acid/hydrogen peroxide treatment. Alternatively, the metal foil layer may be etched before the vias are formed in the composite layers. If the vias in the composite layers have not been metallized yet, they can be metallized at this point to electrically connect the underlying pattern with the top foil pattern. Metallization of the vias may be done by a variety of methods such as barrel-plating the sides of the via with a metal composition or filling the via with a conductive composition such as an epoxy silver paste. A discrete component 13 having leads 12, such as an active component housed in a plastic leaded chip carrier, can then be soldered onto the etched pattern 9. Conventional solder techniques, i.e. high temperature solder, solder reflow, etc. can be used.

We claim:

1. A multilayer interconnect comprising an assemblage and a composite adhered to a surface of the assemblage, the assemblage comprising a ceramic substrate and a patterned conductor layer, and the composite comprising a bottom layer of acrylic or acrylate adhesive, an electrically insulating organic film, and a top metal foil layer, wherein the acrylic adhesive comprises 90-99 wt. % of a terpolymer comprising 15-65 wt. % acrylonitrile, methacrylonitirle, or mixtures thereof, 30-84 wt. % butyl acrylate, ethyl acrylate, 2-ethylhexyl acrylate, laruyl acrylate, or mixtures thereof, and 1-15 wt. % methacrylic acid, acrylic acid, itaconic acid, or mixtures thereof, and 10-1 wt. % cross-linking resin; and the acrylate adhesive comprises 90-99 wt. % of a latex copolymer prepared by free radical-initiated aqueous emulsion polymerization of a mixture of nonacidic monomers comprising 50-60% wt. % lower alkyl acrylate, 30-40 wt. % acrylonitrile, methacrylonitrile or mixtures thereof, and 5-12 wt. % glycidyl acrylate, glycidyl methacrylate or mixtures thereof, having a glass transition temperature of 0-55 C. and a weight average molecular weight of 150,000-1,000,000, and 10-1 wt. % of a water-soluble cross-linking agent.

2. The composite of claim 1 wherein the adhesive comprises the acrylic adhesive.

3. The composite of claim 1 wherein the adhesive comprises the acrylate adhesive.

4. The composite of claim 1 wherein the ceramic substrate comprises ceramic-filled glass, crystallizable glass, aluminum nitride, silicon carbide, alumina or beryllia.

5. The composite of claim 1 wherein the patterned conductor layer comprises copper, silver, palladium, gold, platinum or mixtures thereof.

6. The composite of claim 1 wherein the metal foil comprises copper.

7. The composite of claim 1 wherein the electrically insulating organic film comprises polyimide, polyether-ether ketones, perfluoroalkoxy polymers or polytetrafluoroethylene.

8. A method for forming the multilayer interconnect of claim 1 comprising the steps of:
   a. laminating a composite comprising a bottom layer of the acrylic or acrylate adhesive of claim 1, an electrically insulating organic film and a top metal foil layer to the outermost patterned conductor layer and exposed ceramic areas of an assemblage comprising at least one layer of ceramic having a patterned conductive layer thereon;
   b. forming a patterned array of vias in the composite layers such that the vias are in registration with the outermost patterned conductive layer of step a.; and
   c. metallizing the vias.

9. A method for forming the multilayer interconnect of claim 1 comprising the steps of:
   a. printing and firing a patterned layer of thick film conductor composition on a ceramic substrate;
   b. forming a patterned array of vias in one or more layers of a ceramic tape layer;
   c. laminating the ceramic tape layers of step b. having vias therein over the printed side of the assemblage of step a. and firing the assemblage at 825-1025 C. to form a densified layer of dielectric;
   d. filling the vias of the densified dielectric layer of step c. with a thick film conductor composition and firing the assemblage;
   e. printing and firing at least one patterned thick film functional layer over the fired assemblage of step d.;
   f. repeating the sequence of steps b. through e. for a number of times sufficient to build up a predetermined number of interconnected functional layers, each separated by a densified layer of dielectric;
   g. laminating a composite comprising a bottom layer of the acrylic or acrylate adhesive of claim 1, an electrically insulating organic film and a top metal foil layer to the outermost densified layer of dielectric of the product from step f. and any functional layer thereon such that the bottom layer of adhesive is adjacent to the outermost densified layer of dielectric and any functional layer thereon;
   h. forming a patterned array of vias in the composite layers; and
   i. filling the vias in the composite layers with a conductive composition.

* * * * *